United States Patent
Horikiri et al.

(10) Patent No.: US 11,393,693 B2
(45) Date of Patent: Jul. 19, 2022

(54) STRUCTURE MANUFACTURING METHOD AND INTERMEDIATE STRUCTURE

(71) Applicants: SCIOCS COMPANY LIMITED, Hitachi (JP); SUMITOMO CHEMICAL COMPANY, LIMITED, Tokyo (JP)

(72) Inventors: Fumimasa Horikiri, Hitachi (JP); Noboru Fukuhara, Hitachi (JP)

(73) Assignees: SCIOCS COMPANY LIMITED, Hitachi (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 17/605,834

(22) PCT Filed: Mar. 13, 2020

(86) PCT No.: PCT/JP2020/011151
§ 371 (c)(1),
(2) Date: Oct. 22, 2021

(87) PCT Pub. No.: WO2020/217768
PCT Pub. Date: Oct. 29, 2020

(65) Prior Publication Data
US 2022/0148883 A1 May 12, 2022

(30) Foreign Application Priority Data

Apr. 26, 2019 (JP) .............................. JP2019-086052
Jun. 19, 2019 (JP) .............................. JP2019-113773

(51) Int. Cl.
*H01L 21/306* (2006.01)
*H01L 21/308* (2006.01)
(Continued)

(52) U.S. Cl.
CPC .... *H01L 21/30612* (2013.01); *H01L 21/3083* (2013.01); *H01L 21/32134* (2013.01);
(Continued)

(58) Field of Classification Search
CPC ................................................. H01L 21/30612
(Continued)

(56) References Cited

U.S. PATENT DOCUMENTS

| | | |
|---|---|---|
| 2005/0142810 A1 | 6/2005 | Bridger |
| 2006/0110926 A1 | 5/2006 | Hu et al. |

(Continued)

FOREIGN PATENT DOCUMENTS

| | | |
|---|---|---|
| JP | 2007-519230 A | 7/2007 |
| JP | 2010-212718 A | 9/2010 |

(Continued)

OTHER PUBLICATIONS

International Preliminary Report on Patentability received in International Application No. PCT/JP2020/011151 dated Nov. 4, 2021 (10 pages).

(Continued)

*Primary Examiner* — Hsin Yi Hsieh
(74) *Attorney, Agent, or Firm* — Foley & Lardner LLP

(57) ABSTRACT

A structure manufacturing method including: preparing a treatment object that includes an etching target having a surface to be etched comprising a conductive group III nitride and a region to be etched, a conductive member in contact with at least a portion of a surface of a conductive region of the etching target that is electrically connected to the region to be etched, and a mask formed on the surface to be etched and comprising a non-conductive material; and etching the group III nitride by immersing the treatment object in an alkaline or acidic etching solution containing peroxodisulfate ions as an oxidizing agent that accepts (Continued)

electrons, and irradiating the surface to be etched with light through the etching solution, wherein an edge that defines the region to be etched is constituted by an edge of the mask without including an edge of the conductive member.

23 Claims, 12 Drawing Sheets

(51) Int. Cl.
    *H01L 21/3213* (2006.01)
    *H01L 29/20* (2006.01)
    *H01L 29/778* (2006.01)
    *H01L 29/66* (2006.01)

(52) U.S. Cl.
    CPC .... *H01L 21/32139* (2013.01); *H01L 29/2003* (2013.01); *H01L 29/66462* (2013.01); *H01L 29/778* (2013.01)

(58) Field of Classification Search
    USPC ........................................................ 438/746
    See application file for complete search history.

(56) References Cited

U.S. PATENT DOCUMENTS

| | | |
|---|---|---|
| 2009/0315055 A1 | 12/2009 | Tamboli et al. |
| 2011/0024799 A1 | 2/2011 | Minoura et al. |
| 2014/0167059 A1 | 6/2014 | Hsu et al. |
| 2021/0313186 A1* | 10/2021 | Horikiri ................ H01L 21/308 |
| 2021/0351030 A1* | 11/2021 | Hirikiri .................. H01S 5/022 |

FOREIGN PATENT DOCUMENTS

| | | |
|---|---|---|
| JP | 2011-035214 A | 2/2011 |
| JP | 2011-520296 A | 7/2011 |
| JP | 2015-532009 A | 11/2015 |
| WO | WO-2021020040 A1 * | 2/2021 |
| WO | WO-2021020041 A1 * | 2/2021 |
| WO | WO-2021044724 A1 * | 3/2021 |
| WO | WO-2021162083 A1 * | 8/2021 |

OTHER PUBLICATIONS

Murata et al., "Photo-electrochemical etching of free-standing GaN wafer surfaces grown by hydride vapor phase epitaxy," Electrochimica Acta, vol. 171, 2015, pp. 89-95.

Samukawa, Seiji, "Ultimate Top-down Etching Processes for Future Nanoscale Devices: Advanced Neutral-Beam Etching," Japanese Journal of Applied Physics, vol. 45, No. 4A, 2006, pp. 2395-2407.

Faraz et al., "Atomic Layer Etching: What Can We Learn from Atomic Layer Deposition?" ECS Journal of Solid State Science and Technology, vol. 4, No. 6, 2015, pp. N5023-N5032.

International Searching Authority, "International Search Report," issued in connection with International Patent Application No. PCT/JP2020/011151, dated Apr. 14, 2020.

International Searching Authority, "Written Opinion," issued in connection with International Patent Application No. PCT/JP2020/011151, dated Apr. 14, 2020.

* cited by examiner

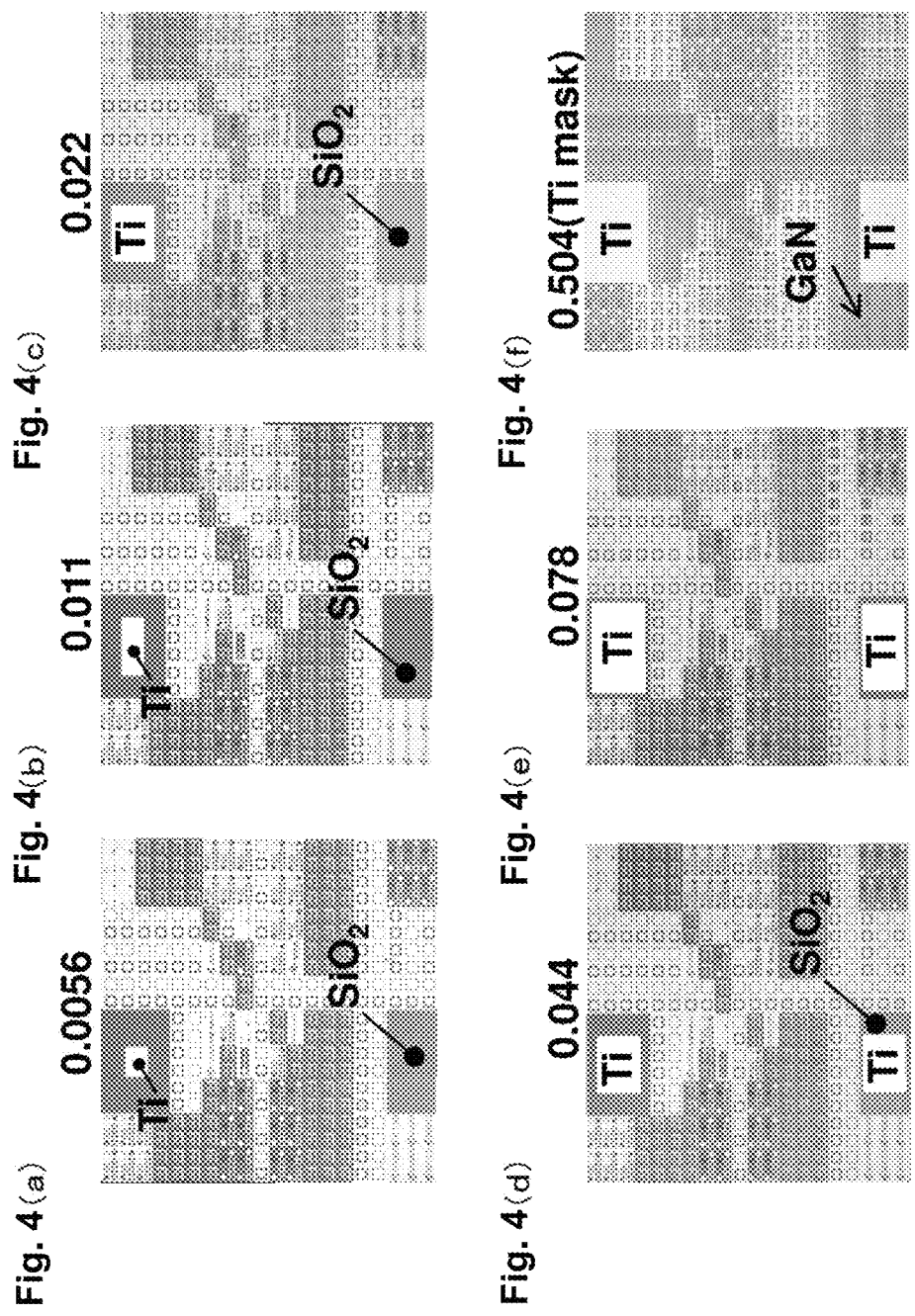

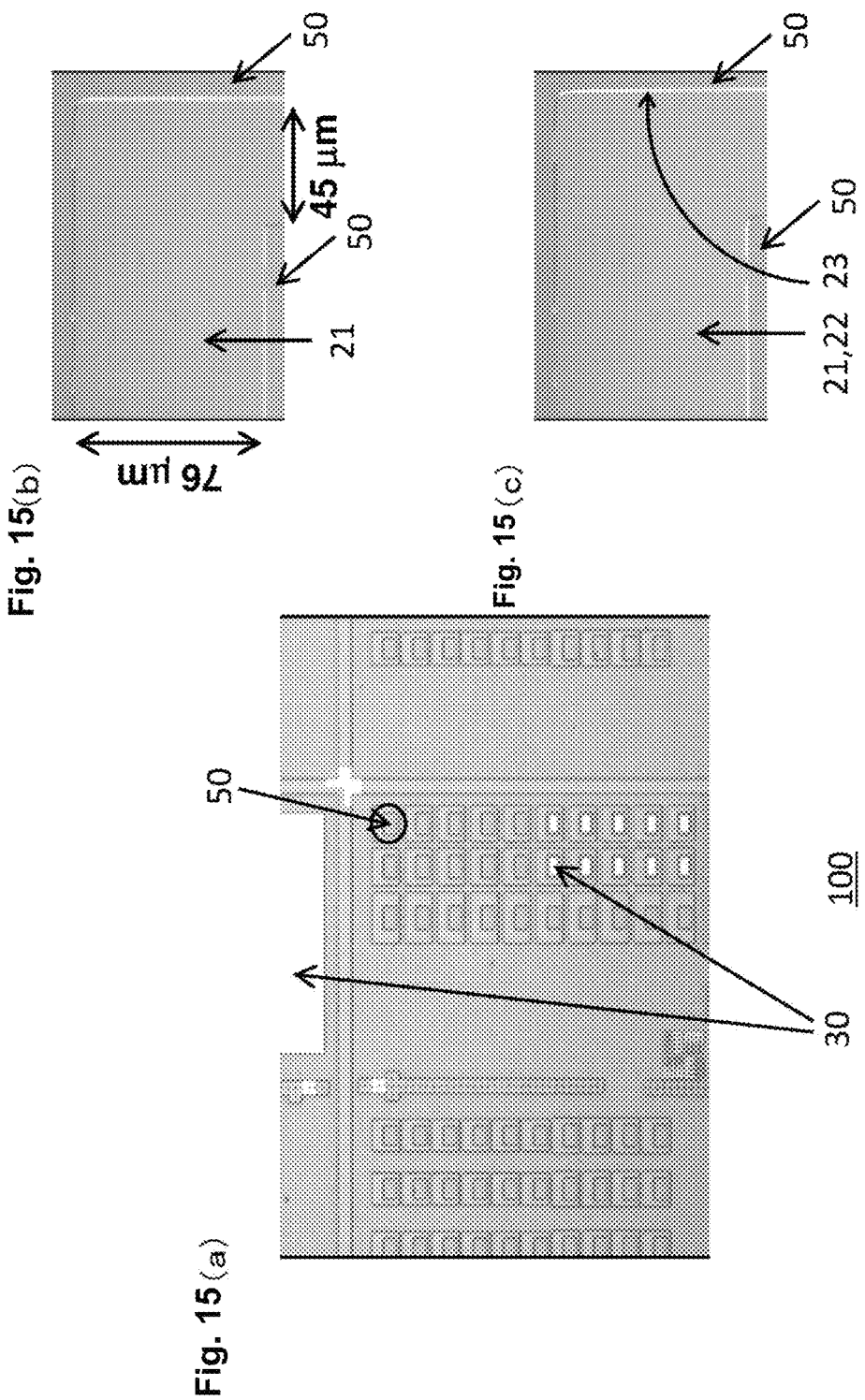

STRUCTURE MANUFACTURING METHOD AND INTERMEDIATE STRUCTURE

CROSS-REFERENCE TO RELATED APPLICATIONS

The present application claims priority under 37 U.S.C. § 371 to International Patent Application No. PCT/JP2020/011151, filed Mar. 13, 2020, which claims priority to and the benefit of Japanese Patent Application Nos. 2019-086052, filed on Apr. 26, 2019, and 2019-113773, filed on Jun. 19, 2019. The contents of these applications are hereby incorporated by reference in their entireties.

TECHNICAL FIELD

The present invention relates to a structure manufacturing method and an intermediate structure.

BACKGROUND ART

Group III nitrides such as gallium nitride (GaN) are used as materials for manufacturing semiconductor devices such as light emitting devices and transistors.

Photoelectrochemical (PEC) etching has been proposed as an etching technique for forming various structures on group III nitrides such as GaN (see, for example, Non-Patent Document 1). The PEC etching is wet etching with less damage than general dry etching, and is preferable because an apparatus is simple, compared to special dry etching with less damage such as neutral particle beam etching (see, for example, Non-Patent Document 2) and atomic layer etching (see, for example, Non-Patent Document 3).

CITATION LIST

Non-Patent Documents

Non-Patent Document 1: J. Murata et at, "Photo-electrochemical etching of free-standing GaN wafer surfaces grown by hydride vapor phase epitaxy", Electrochimica Acta 171 (2015) 89-95

Non-Patent Document 2: S. Samukawa, JJAP, 45 (2006) 2395.

Non-Patent Document 3: T. Faraz, ECS J. Solid Stat. Scie. & Technol., 4, N5023 (2015).

SUMMARY OF INVENTION

Technical Problem

An object of the present invention is to provide a technique for favorably advancing PEC etching of group III nitrides.

Solution to Problem

According to an aspect of the present invention, there is provided a structure manufacturing method, including:

preparing a treatment object that includes an etching target having a surface to be etched comprising a conductive group III nitride and a region to be etched located on the surface to be etched, a conductive member that is provided so as to be in contact with at least a portion of a surface of a conductive region of the etching target that is electrically connected to the region to be etched, and a mask formed on the surface to be etched and comprising a non-conductive material; and etching the group III nitride that constitutes the region to be etched by immersing the treatment object in an alkaline or acidic etching solution containing peroxodisulfate ions as an oxidizing agent that accepts electrons, and irradiating the surface to be etched with light through the etching solution in a state where the region to be etched and the conductive member are in contact with the etching solution, wherein an edge that defines the region to be etched is constituted by an edge of the mask without including an edge of the conductive member.

According to another aspect of the present invention, there is provided an intermediate structure, including:

an etching target having a surface to be etched comprising a conductive group III nitride and a region to be etched located on the surface to be etched;

a conductive member that is provided so as to be in contact with at least a portion of a surface of a conductive region of the etching target that is electrically connected to the region to be etched; and a mask formed on the surface to be etched and comprising a non-conductive material, wherein the intermediate structure is immersed in an alkaline or acidic etching solution containing peroxodisulfate ions as an oxidizing agent that accepts electrons, in a state where the region to be etched is in contact with the conductive member, and an edge that defines the region to be etched is constituted by an edge of the mask without including an edge of the conductive member.

Advantageous Effects of Invention

There is provided a technique for favorably advancing PEC etching of group III nitrides.

BRIEF DESCRIPTION OF DRAWINGS

FIGS. 4(a) to 4(f) are photographs showing first to sixth treatment objects of experimental examples according to PEC etching in the first embodiment.

FIG. 15(a) is a photograph showing a treatment object provided with a non-conductive mask and a cathode pad, and FIGS. 15(b) and 15(c) are enlarged photographs of a portion of a region indicated by an upper right circle of FIG. 15(a).

DESCRIPTION OF EMBODIMENTS

First Embodiment

A structure manufacturing method according to a first embodiment of the present invention will be described. This manufacturing method includes an etching step using photoelectrochemical (PEC) etching applied to an etching target 10 (hereinafter, also referred to as a wafer 10), which is a material of the structure (hereinafter, also referred to as PEC etching step). PEC etching is also simply referred to as etching.

Figure 1A:
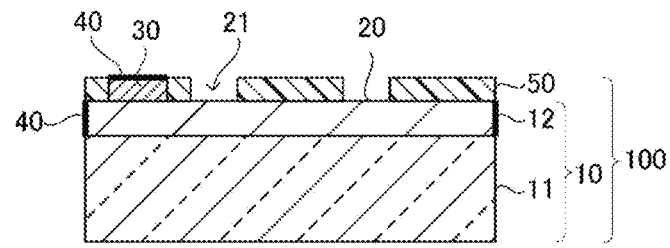
FIG. 1(a) is a schematic cross-sectional view illustrating a treatment object according to a first embodiment of the present invention.

The wafer 10 includes a substrate 11 and a group III nitride layer 12 (also referred to as "epitaxial layer 12" hereinafter) formed on the substrate 11 (see FIG. 1(a)). An upper surface of the epitaxial layer 12 constitutes a surface 20 to be etched. The surface 20 to be etched comprises a conductive group III nitride. A region 21 to be etched is located on the surface 20 to be etched.

An object to be PEC-etched, that is, an object to be immersed (contacted) in an etching solution 201 is referred to as a treatment object 100. The treatment object 100 can be regarded as an intermediate stage structure (intermediate structure) for obtaining a final structure. The treatment object 100 may have at least the wafer 10 and may further have, for example, a mask 50 serving as a member required for a PEC etching process. The mask 50 is formed in a pattern in which the region 21 to be etched is open on the surface 20 to be etched of the wafer 10. That is, the mask 50 is disposed at a position where it defines the region 21 to be etched.

Before the structure manufacturing method according to this embodiment is described in detail, first, an experiment performed for preliminary examination (also referred to as "preliminary experiment" hereinafter) will be described. In the preliminary experiment, how the progression of PEC etching changes was examined by changing the structure, arrangement, and the like of the treatment object 100. The PEC etching step (see FIG. 1(c)) and the mechanism of PEC etching (see (Chemical Formula 1) to (Chemical Formula 7)) will be described in detail.

FIGS. 10(a) to 10(d) are schematic cross-sectional views showing the treatment object 100 in a preliminary experiment. In the preliminary experiment, PEC etching was performed in a state where the treatment object 100 is immersed in the etching solution 201 stored in the container 210.

An acidic mixture in which a 0.1 M phosphoric acid ($H_3PO_4$) aqueous solution and a 0.05 M $K_2S_2O_8$ aqueous solution were mixed in a ratio of 1:1 was used as the etching solution 201. The surface 20 to be etched was irradiated with the UV light 221 through the etching solution 201. The irradiation wavelength of the UV light 221 was 260 nm, and the irradiation intensity (I) of the UV light 221 was 4 mW/cm$^2$. Distance L ($d_{electrolyte}$) from the surface 20 to be etched to the upper surface 202 of the etching solution 201 was 5 mm. The mask 50 was made of a silicon oxide ($SiO_2$), which is a non-conductive material.

FIGS. 10(a) to 10(d) respectively show the states of the first to fourth preliminary experiments. In the first, second, and fourth preliminary experiments, an n-type conductive gallium nitride (GaN) substrate was used as the substrate 11 of the wafer 10. In the third preliminary experiment, a semi-insulating sapphire substrate was used as the substrate 11 of the wafer 10. Here, "conductive" refers to a state where specific electrical resistance is less than $10^5$ Ωcm, and "semi-insulating" refers to a state where specific electrical resistance is $10^5$ Ωcm or more, for example. In all of the first to fourth preliminary experiments, an n-type conductive GaN layer was grown on the substrate 11 as the epitaxial layer 12.

On the surface 20 to be etched that is the upper surface of the epitaxial layer 12, the region 21 to be etched is defined as a portion exposed to the etching solution 201. As will be described later, it is conceivable that the region 21 to be etched functions as an anode in PEC etching.

It is conceivable that, as will be described later, on the surface of the conductive region of the treatment object 100 that is electrically connected to the region 21 to be etched, a portion exposed to the etching solution 201 can function as a cathode in PEC etching. The region that can function as the cathode in PEC etching is referred to as a cathode region 40 hereinafter. The cathode region 40 is indicated by a thick line in FIGS. 10(a) to 10(d). Note that indication of the cathode region 40 using the thick line is the same as in FIGS. 1(a) and 9, which will be described later.

Figure 10A:
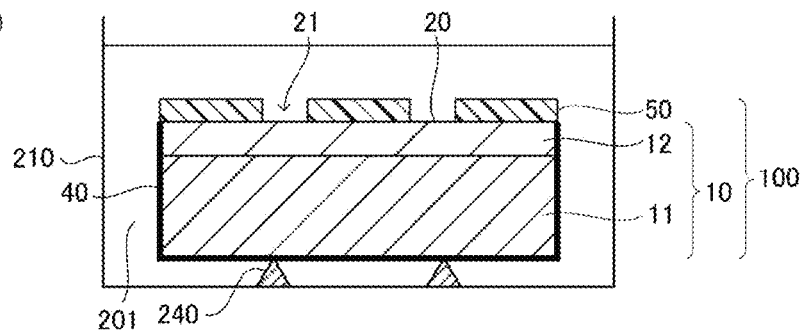
FIGS. 10(a) to 10(d) are schematic cross-sectional views showing a treatment object in a preliminary experiment.

See FIG. 10(a). In the first preliminary experiment, the treatment object 100 is disposed on support members (spacers) 240 in a mode in which the bottom surface of the conductive GaN substrate 11 is exposed to the etching solution 201. In the first preliminary experiment, the cathode region 40 is constituted by side surfaces of the substrate 11 and the epitaxial layer 12, and the bottom surface of the substrate 11.

Figure 10B:
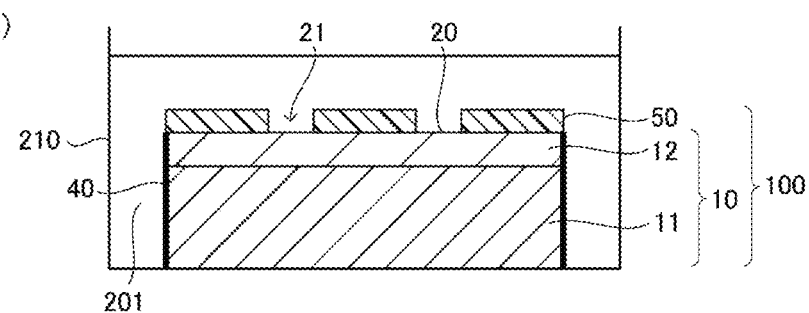

See FIG. 10(b). In the second preliminary experiment, the treatment object 100 is disposed on the bottom surface of the container 210 in a mode in which the bottom surface of the conductive GaN substrate 11 is not exposed to the etching solution 201. In the second preliminary experiment, the cathode region 40 is constituted by the side surfaces of the substrate 11 and the epitaxial layer 12.

Figure 10C:
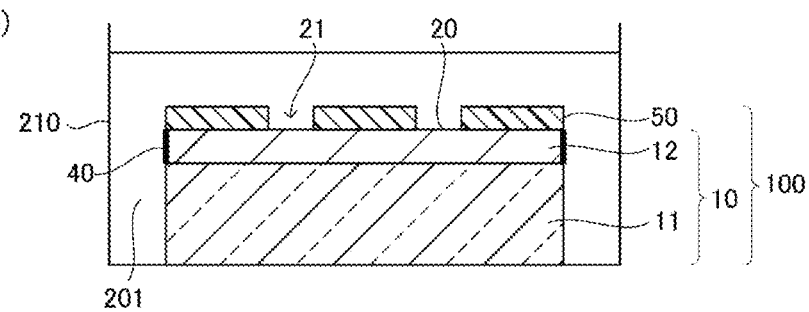
Figure 10D:
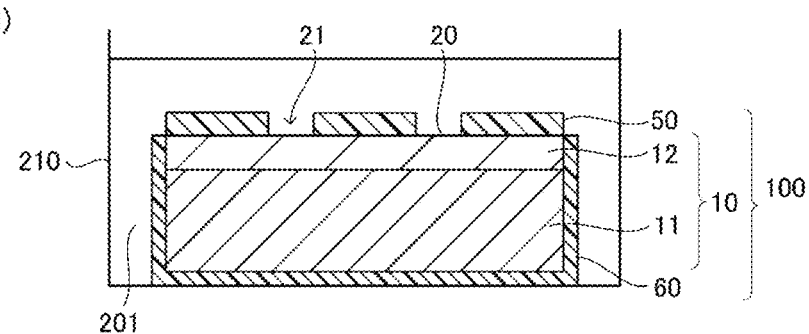

See FIG. 10(c). In the third preliminary experiment, similarly to the second preliminary experiment, the treatment object 100 is disposed on the bottom surface of the container 210. In the third preliminary experiment, the semi-insulating sapphire substrate 11 is used, and thus the surface of the substrate 11 does not serve as the cathode region 40 even if it is exposed to the etching solution 201, and only the side surfaces of the epitaxial layer 12 constitute the cathode region 40.

See FIG. 10(*d*). In the fourth preliminary experiment, similarly to the second preliminary experiment, the treatment object 100 is disposed on the bottom surface of the container 210. The treatment object 100 in the fourth preliminary experiment has a resist coat 60 in addition to the wafer 10 and the mask 50. The resist coat 60 is formed so as to cover the side surfaces of the wafer 10, that is, the side surfaces of the substrate 11 and the epitaxial layer 12, and the bottom surface of the wafer 10, that is, the bottom surface of the substrate 11. Note that, if the alkaline etching solution 201 is used, the resist coat 60 will peel away, and thus the acidic etching solution 201 is used in this preliminary experiment.

Similarly to the first and second preliminary experiments, the conductive GaN substrate 11 is used in the fourth preliminary experiment. However, because the resist coat 60 is formed, the side surfaces of the substrate 11 and the epitaxial layer 12, and the bottom surface of the substrate 11 are not exposed to the etching solution 201. Thus, the cathode region 40 is not present in the fourth preliminary experiment.

In the first, second, and fourth preliminary experiments, a 6 mm-square GaN substrate 11 having a thickness of 0.4 mm was used, and a GaN layer (n-GaN) having a thickness of 10 µm and an n-type impurity concentration of $1 \times 10^{16}/cm^3$ was formed as the epitaxial layer 12 on the GaN substrate 11. The areas of the cathode regions 40 in the first, second, and fourth preliminary experiments were respectively 0.456 $cm^2$, 0.096 $cm^2$, and 0 $cm^2$. Note that here the epitaxial layer 12 is far thinner than the GaN substrate 11, and thus the area of the cathode region 40 realized by the side surfaces of the epitaxial layer 12 is approximately set to 0. In the third preliminary experiment, a 6 mm-square sapphire substrate 11 having a thickness of 0.4 mm was used, and a laminate of a GaN layer (un-GaN) to which no impurities are added and that has a thickness of 3 µm and a GaN layer (n-GaN) that has a n-type impurity concentration of $1.2 \times 10^{16}/cm^3$ and a thickness of 2 µm was formed as the epitaxial layer 12 on the sapphire substrate 11 (this structure is the same as that shown in FIG. 1(*b*), which will be described later). The area of the cathode region 40 in the third preliminary experiment is 0.00048 $cm^2$ (the area of the side surfaces of the n-GaN, which is a conductive portion of the epitaxial layer 12).

The sulfate ion radicals ($SO_4^-$*radicals) can be generated by irradiating the surface 20 to be etched with the UV light 221 through the etching solution 201. It is considered that $SO_4^-$*radicals are present in the etching solution 201 from the surface 20 to be etched downward to some extent. It is conceivable that in the cathode region 40 (the region that can function as a cathode in PEC etching), a region where $SO_4^-$*radicals are present effectively functions as a cathode (an effective cathode region).

It is conceivable that the side surfaces of the epitaxial layer 12 and the side surfaces of the substrate 11 are effective cathode regions in the first and second preliminary experiments. It is conceivable that the side surfaces of the epitaxial layer 12 are effective cathode regions in the third preliminary experiment. However, it is considered that the $SO_4^-$*radicals are present in an outer peripheral portion of the bottom surface of the substrate 11 without reaching the vicinity of the center of the bottom surface of the substrate 11 in the first preliminary experiment. That is, it is considered that the effective cathode region of the bottom surface of the substrate 11 is the outer peripheral portion of the bottom surface of the substrate 11 in the first preliminary experiment. Based on the results shown in FIG. 11 below, it is conceivable that the outer peripheral portion, which has a width of about 0.4 mm, of the bottom surface of the substrate 11 is an effective cathode region in the first preliminary experiment. It is estimated that the area of the effective cathode region is 0.192 $cm^2$ in the first preliminary experiment. In the second to fourth preliminary experiments, the areas of the effective cathode regions are respectively equal to the areas of the above-described cathode regions 40, and are respectively 0.096 $cm^2$, 0.00048 $cm^2$, and 0 $cm^2$.

Figure 11:
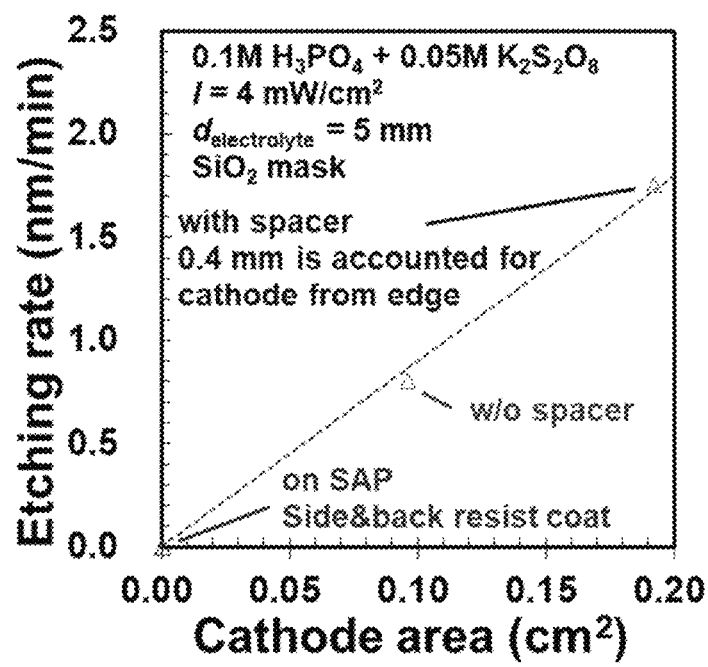
FIG. 11 is a graph illustrating a result of PEC etching in a preliminary experiment.

FIG. 11 is a graph illustrating a result of PEC etching in a preliminary experiment. The horizontal axis indicates the area of the effective cathode region (Cathode area), and the vertical axis indicates the etching rate. The result of the first preliminary experiment is indicated by "with spacer", the result of the second preliminary experiment is indicated by "w/o spacer", the result of the third preliminary experiment is indicated by "on SAP", and the result of the fourth preliminary experiment is indicated by "Side & back resist coat".

Based on these results, it can be seen that the larger the area of the effective cathode region is, the higher the etching rate is. Furthermore, based on this, it is conceivable that, in order to favorably advance PEC etching of the region 21 to be etched, which is an anode, it is preferable to increase the area of the effective cathode region in order to improve the electrical balance, and thus, to provide a large cathode region 40, which is a region that can function as a cathode.

By using the conductive substrate 11 in the first and second preliminary experiments, a large cathode region 40 can be provided utilizing the side surfaces or the bottom surface of the substrate 11, and thus the etching rate can be easily increased. In contrast, as a result of using the semi-insulating substrate 11 in the third preliminary experiment, the cathode region 40 is constituted by a narrow region formed only of the side surfaces of the epitaxial layer 12, and thus it is difficult to increase the etching rate. As can be seen from FIG. 11, similarly to the fourth preliminary experiment in which no cathode region 40 is present, there is minimal progress in the etching in the third preliminary experiment.

Note that even when the semi-insulating substrate 11 is used, if the mask 50 is made of a conductive material, the surface of the mask 50 functions as the cathode region 40. This is because the mask 50 is electrically connected to the region 21 to be etched. In such a case, it is possible to further increase the etching rate than in a case where the mask 50 is made of a non-conductive material.

There are cases where the wafer 10 on which the epitaxial layer 12 is grown on the semi-insulating substrate 11, which is a sapphire substrate, a silicon carbide (SiC) substrate, or a semi-insulating GaN substrate, for example, needs to be used as a material for manufacturing a semiconductor device in which a group III nitride is used. Furthermore, in such a case, the mask 50 may need to be made of a non-conductive material such as a resist or silicon oxide.

As can be seen from the result of the third preliminary experiment, when the semi-insulating substrate 11 is used and the mask 50 is made of a non-conductive material, it is difficult to favorably advance PEC etching. The inventors of this application propose a technique with which PEC etching can be favorably achieved even in such a case.

Details of the structure manufacturing method according to the first embodiment will be described below. FIG. 1(a) is a schematic cross-sectional view showing the treatment object 100 according to the first embodiment. First, as shown in FIG. 1(a), the treatment object 100 is prepared. The treatment object 100 according to this embodiment has the cathode pad (conductive member) 30 in addition to the wafer 10 and the mask 50.

In this embodiment, a semi-insulating substrate, which is a sapphire substrate, a SiC substrate, or a (semi-insulating) GaN substrate, for example, is used as the substrate 11. The mask 50 is made of a non-conductive material such as a resist or silicon oxide, for example. The shape, size, etching depth, etc. of the region 21 to be etched may be selected as appropriate and as needed. The mask 50 is disposed at a position where it defines the region 21 to be etched (the edge defining the region 21 to be etched is configured to include the edge of the mask 50).

A cathode pad 30 is a conductive member made of a conductive material. The cathode pad 30 is provided so as to be in contact with at least a portion of the surface of the conductive region of the wafer 10 that is electrically connected to the region 21 to be etched. The cathode pad 30 shown in FIG. 1(a) as an example is disposed on the surface 20 to be etched in a region enclosed by the mask 50 in a plan view, preferably in a state where the cathode pad 30 is in contact with the mask 50 (in a state where the surface 20 to be etched is not exposed from a gap between the mask 50 and the cathode pad 30). The cathode pad 30 is not disposed at a position where it defines the region 21 to be etched.

The wording "the cathode pad 30 is not disposed at a position where it defines the region 21 to be etched" refers to at least a portion of the cathode pad 30 being "not disposed at a position where it defines the region 21 to be etched", that is, the wording means that the cathode pad 30 has a portion that does not function as a mask defining the region 21 to be etched (only the cathode pad 30 is not defined as the mask in the region 21 to be etched, and the edge defining the region 21 to be etched is not constituted by the edge of the cathode pad 30 alone). Note that the arrangement mode of the cathode pad 30 may be adjusted as appropriate and as needed. The cathode pad 30 may be disposed in a region that is not enclosed by the mask 50 in a plan view, for example. The edge of the cathode pad 30 may include a portion included in the edge defining the region 21 to be etched, and may have a portion that is not included in the edge defining the region 21 to be etched.

A material that has a low Schottky barrier height with respect to the surface 20 to be etched and is resistant to the etching solution 201 (resistant against an alkali or acid) is preferably used as the material of the cathode pad 30. Specifically, metal such as titanium (Ti) is preferably used, for example. In addition to Ti, Ti/Au in which gold (Au) is laminated on Ti, nickel (Ni), platinum (Pt), a single layer of Au, or the like can also be used, for example.

When the treatment object 100 is immersed in the etching solution 201, the upper surface of the cathode pad 30 is exposed to the etching solution 201. Therefore, the upper surface of the cathode pad 30 functions as the cathode region 40. In this embodiment, in addition to the side surfaces of the epitaxial layer 12, the upper surface of the cathode pad 30 also functions as the cathode region 40 in this manner.

As a result of providing the cathode pad 30, the cathode region 40 is larger in this embodiment than in a case where the cathode pad 30 is not provided. Accordingly, it is possible to favorably advance PEC etching, compared to the case where the cathode pad 30 is not provided.

With the cathode pad 30 in this embodiment, the upper surface of the cathode pad 30 can be utilized as the cathode region 40, and thus a large cathode region 40 can be easily provided. Also, because the cathode pad 30 is provided on the surface 20 to be etched, $SO_4^{-*}$ radicals generated by irradiating the surface 20 to be etched with the UV light 221 can be more reliably present in the vicinity of the upper surface of the cathode pad 30. Accordingly, the upper surface of the cathode pad 30 can be easily utilized as an effective cathode region.

Figure 1B:
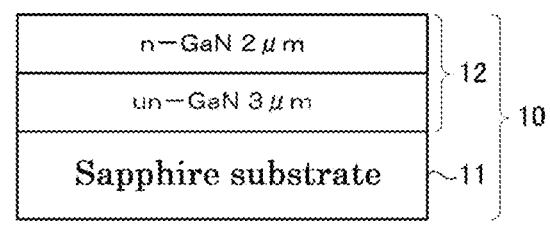
FIG. 1(b) is a schematic cross-sectional view showing an example of an etching target according to the first embodiment.

FIG. 1(b) is a schematic cross-sectional view showing one example (which is used in an experimental example, which will be described later) of the structure of the wafer 10. The substrate 11 is a sapphire substrate. The epitaxial layer 12 is constituted by a laminate of the GaN layer (un-GaN) to which no impurities are added and that has a thickness of 3 μm and a GaN layer (n-GaN) to which n-type impurities are added and that has a carrier concentration (net donor concentration) of $1.2\times10^{16}/cm^3$ and has a thickness of 2 μm.

Figure 1C:
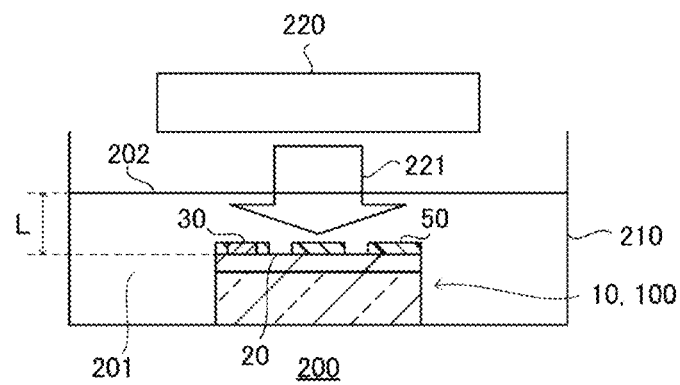
FIG. 1(c) is a schematic view of a PEC etching apparatus illustrating a PEC etching step according to the first embodiment.

FIG. 1(c) is a schematic cross-sectional view of a PEC etching apparatus 200 illustrating the PEC etching step. The PEC etching apparatus 200 includes a container 210 for storing the etching solution 201 and a light source 220 for emitting ultraviolet (UV) light 221.

In the PEC etching step, the group III nitride constituting the region 21 to be etched is etched by irradiating the surface 20 to be etched with UV light 221 through the etching solution 201 in a state where the treatment object 100 is immersed in the etching solution 201 and the region 21 to be etched and the cathode pad 30 are in contact with the etching solution 201. Details of the etching solution 201, the UV light 221, and a mechanism of the PEC etching will be described later.

Note that if necessary, the structure manufacturing method may include steps such as electrode formation and protective film formation as other steps.

Figure 2A:
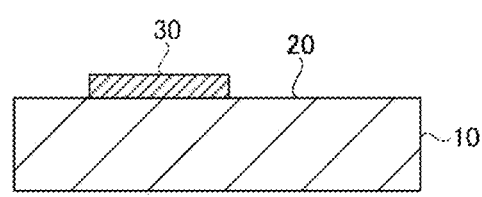
FIGS. 2(a) to 2(c) are schematic cross-sectional views showing a first example of a method for forming a cathode pad.
Figure 2B:
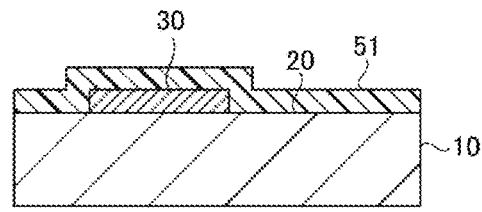
Figure 2C:
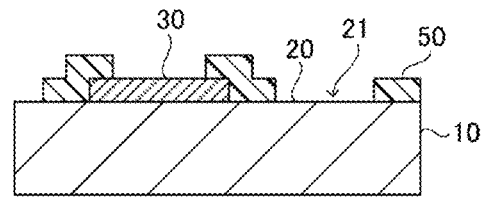

Next, a method for forming the cathode pad 30 will be described as an example. FIGS. 2(a) to 2(c) are schematic cross-sectional views showing a first example of the method for forming the cathode pad 30. In the first example, the cathode pad 30 is formed before the mask 50 is formed. An example of the material of the mask 50 is a resist.

First, as shown in FIG. 2(a), the cathode pad 30 is formed on the surface 20 to be etched of the wafer 10 using Ti, for example, and a lift-off process or the like. Next, as shown in FIG. 2(b), a resist film 51 is formed on the entire surface 20 to be etched so as to cover the cathode pad 30. Then, as shown in FIG. 2(c), the mask 50 is formed by making a pattern in the resist film 51. The mask 50 has an opening where the region 21 to be etched is exposed, and has an opening where the upper surface of the cathode pad 30 is exposed.

Figure 3A:
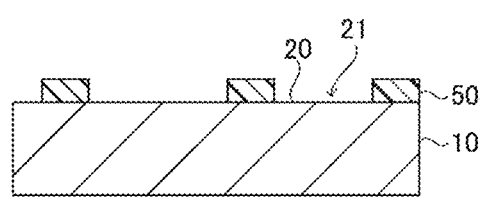
FIGS. 3(a) to 3(c) are schematic cross-sectional views showing a second example of a method for forming a cathode pad.
Figure 3B:
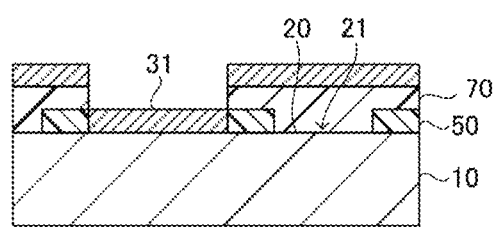
Figure 3C:
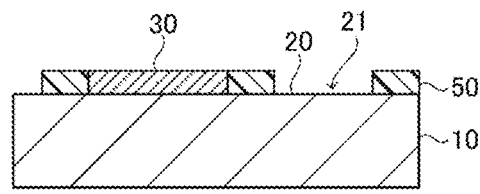

FIGS. 3(a) to 3(c) are schematic cross-sectional views showing a second example of the method for forming the cathode pad 30. In the second example, the cathode pad 30 is formed after the mask 50 is formed. An example of the material of the mask 50 is a silicon oxide.

First, as shown in FIG. 3(a), after a silicon oxide film is formed on the entire surface 20 to be etched of the wafer 10, the mask 50 is formed by making a pattern in this silicon oxide film through photolithography and etching. The mask 50 has an opening where the region 21 to be etched is exposed, and has an opening in the region in which the cathode pad 30 is to be formed.

Then, as shown in FIG. 3(b), a resist pattern 70 for a lift-off process is formed so as to cover the region 21 to be etched and to expose the region in which the cathode pad 30 is to be formed. A Ti film 31 is formed on the entire surface 20 to be etched.

Then, as shown in FIG. 3(c), the cathode pad 30 is formed (remains) in the region where the cathode pad 30 is to be formed, through a lift-off process, that is, by removing an unnecessary portion from the Ti film 31 together with the resist pattern 70.

If, for example, the mask 50 is formed using a silicon oxide, hydrofluoric acid is preferably used to perform etching when forming the mask 50. When the mask 50 is formed after the cathode pad 30 has been formed, there is a concern that the cathode pad 30 may also be etched by the hydrofluoric acid. Such unnecessary etching of the cathode pad 30 can be avoided by forming the cathode pad 30 after the mask 50 has been formed as in the second example.

Next, details of the etching solution 201, the UV light 221, and the mechanism of the PEC etching will be described. GaN is exemplified as the group III nitride to be etched.

The alkaline or acidic etching solution 201 containing oxygen used for generating an oxide of a group III element contained in the group III nitride constituting the region 21 to be etched, and further containing an oxidizing agent that accepts electrons, is used as the etching solution 201. Peroxodisulfate ions ($S_2O_8^{2-}$) are exemplified as the oxidizing agent.

First examples of the etching solution 201 include a mixture of an aqueous solution of potassium hydroxide (KOH) and an aqueous solution of potassium persulfate ($K_2S_2O_8$), the mixture being alkaline when etching is started. Such an etching solution 201 is prepared, for example, by mixing a 0.01 M KOH aqueous solution and a 0.05 M $K_2S_2O_8$ aqueous solution in a ratio of 1:1. The concentration of the KOH aqueous solution, the concentration of the $K_2S_2O_8$ aqueous solution, and the mixing ratio of these aqueous solutions may be adjusted as appropriate and as needed. Note that, by reducing the concentration of the KOH aqueous solution, for example, the etching solution 201 in which the KOH aqueous solution and the $K_2S_2O_8$ aqueous solution are mixed together can also be acidic when etching is started.

The PEC etching mechanism at the time of using the etching solution 201 of the first example will be described. Holes and electrons are generated as a pair in the GaN constituting the region 21 to be etched, by irradiating the surface 20 to be etched with UV light 221 having a wavelength of 365 nm or less. Gallium oxide ($Ga_2O_3$) is generated by decomposing the GaN into $Ga^{3+}$ and $N_2$ using the generated holes (Chemical formula 1) and further by oxidizing $Ga^{3+}$ using hydroxide ions ($OH^-$) (Chemical Formula 2). Then, the generated $Ga_2O_3$ is dissolved in an alkali or an acid. PEC etching of GaN is performed in this way. Note that the generated holes react with water and the water is decomposed to generate oxygen (Chemical Formula 3).

$$GaN(s)+3h^+ \rightarrow Ga^{3+}+\tfrac{1}{2}N_2(g)\uparrow \qquad \text{[Chemical Formula 1]}$$

$$Ga^{3+}+3OH^- \rightarrow \tfrac{1}{2}Ga_2O_3(s)+\tfrac{3}{2}H_2O(l) \qquad \text{[Chemical Formula 2]}$$

$$H_2O(l)+2h^+ \rightarrow \tfrac{1}{2}O_2(g)\uparrow+2H^+ \qquad \text{[Chemical Formula 3]}$$

Further, peroxodisulfate ion ($S_2O_8^{2-}$) is generated by dissolving $K_2S_2O_8$ in water (Chemical Formula 4), and sulfate ion radicals ($SO_4^{-*}$ radicals) are generated by irradiating $S_2O_8^{2-}$ with UV light 221 (Chemical Formula 5). The electrons generated in pairs with holes react with water together with $SO_4^{-*}$ radicals, and the water is decomposed to generate hydrogen (Chemical Formula 6). As described above, in the PEC etching of the present embodiment, by using $SO_4^{-*}$ radicals, the electrons generated in pairs with holes can be consumed in GaN, and therefore PEC etching can be favorably advanced. Note that, as indicated by (Chemical Formula 6), as the PEC etching progresses, the acidity of the etching solution 201 increases (pH decreases) due to an increase in the number of sulfate ions ($SO_4^{2-}$).

$$K_2S_2O_8 \rightarrow 2K^+ + S_2O_8^{2-} \qquad \text{[Chemical Formula 4]}$$

$$S_2O_8^{2-} + \text{heat or } h\nu \rightarrow 2SO_4^{-*} \qquad \text{[Chemical Formula 5]}$$

$$2SO_4^{-*}+2e^-+2H_2O(l) \rightarrow 2SO_4^{2-}+2HO^*+H_2(g)\text{[Chemical Formula 6]}$$

Second examples of the etching solution 201 include a mixture of a phosphoric acid ($H_3PO_4$) aqueous solution and a potassium persulfate ($K_2S_2O_8$) aqueous solution, the mixture being acidic when etching is started. Such an etching solution 201 is prepared, for example, by mixing a 0.01 M $H_3PO_4$ aqueous solution and a 0.05 M $K_2S_2O_8$ aqueous solution in a ratio of 1:1. The concentration of the $H_3PO_4$ aqueous solution, the concentration of the $K_2S_2O_8$ aqueous solution, and the mixing ratio of these aqueous solutions may be adjusted as appropriate and as needed. Because the $H_3PO_4$ aqueous solution and the $K_2S_2O_8$ aqueous solution are acidic, the etching solution 201 in which the $H_3PO_4$ aqueous solution and the $K_2S_2O_8$ aqueous solution are mixed is acidic at an arbitrary mixing ratio. It is preferable that the etching solution 201 is acidic from the viewpoint of facilitating the use of the resist mask as the mask 50, for example.

Regarding the PEC etching mechanism in the case of using the etching solution 201 of the second example, it is considered that (Chemical Formula 1) to (Chemical Formula 3) described in the case of using the etching solution 201 of the first example are replaced with (Chemical Formula 7). That is, $Ga_2O_3$, hydrogen ions ($H^+$), and $N_2$ are generated through the reaction of GaN, holes generated through irradiation with UV light 221 and water (Chemical Formula 7). Then, the generated $Ga_2O_3$ is dissolved in acid. PEC etching of GaN is performed in this way. Note that the mechanism in which the electrons generated in pairs with holes are consumed by $S_2O_8^{2-}$ as shown in (Chemical Formula 4) to (Chemical Formula 6) is the same as in the case of using the etching solution 201 of the first example.

$$\begin{aligned}GaN(s)+3h^++3/2H_2O(l) \rightarrow &\tfrac{1}{2}Ga_2O_3(s)+\\&3H_++\tfrac{1}{2}N_2(g)\uparrow\end{aligned} \qquad \text{[Chemical Formula 7]}$$

As can be seen from (Chemical Formula 1) and (Chemical Formula 2), or (Chemical Formula 7), it is conceivable that the region 21 to be etched where GaN is PEC-etched functions as an anode where holes are consumed. Also, as can be seen from (Chemical Formula 6), it is conceivable that, on the surface of the conductive region of the treatment object 100 that is electrically connected to the region 21 to be etched, a portion exposed to the etching solution 201 functions as a cathode where electrons are consumed (emitted).

As shown in (Chemical Formula 5), at least one of irradiation with UV light 221 and heating can be used as a method for generating $SO_4^{-*}$ radicals from $S_2O_8^{2-}$. When using irradiation with UV light 221, in order to increase the light absorption by $S_2O_8^{2-}$ and efficiently generate $SO_4^{-*}$ radicals, the wavelength of the UV light 221 is preferably 200 nm or more and less than 310 nm. That is, from a viewpoint of efficiently producing holes in the group III nitride in the wafer 10 and generating $SO_4^{-*}$ radicals from $S_2O_8^{2-}$ in the etching solution 201 through irradiation with UV light 221, the wavelength of the UV light 221 is preferably 200 nm or more and less than 310 nm. When the generation of $SO_4^-{}^*$ radicals from $S_2O_4^-{}^*$ is carried out by heating, the wavelength of the UV light 221 may be 310 nm or more (365 nm or less).

When generating $SO_4^-{}^*$ radicals from $S_2O_8^{2-}$ through irradiation with UV light 221, a distance L from the surface 20 to be etched of the wafer 10 to an upper surface 202 of the etching solution 201 is preferably, for example, 5 mm or more and 100 mm or less. When the distance L is excessively short, for example, less than 5 mm, the amount of $SO_4^-{}^*$ radicals generated in the etching solution 201 above the wafer 10 may become unstable due to fluctuations in the distance L. Further, when the distance L is excessively long, for example, over 100 mm, in the etching solution 201 above the wafer 10, a large amount of $SO_4^-{}^*$ radicals that do not contribute to PEC etching are unnecessarily generated, and therefore utilization efficiency of the etching solution 201 is reduced.

Note that PEC etching can also be applied to a group III nitride other than the exemplified GaN. A group III element contained in the group III nitride is at least one of aluminum (Al), gallium (Ga), and indium (In). The concept of PEC etching applied to an Al component or an In component in the group III nitride is the same as the concept described for the Ga component with reference to (Chemical Formula 1) and (Chemical Formula 2), or (Chemical Formula 7). That is, PEC etching can be performed by generating holes through irradiation with UV light 221 to generate an oxide of Al or an oxide of In, and by dissolving these oxides in an alkali or acid. The wavelength (365 nm or less) of the UV light 221 may be changed as appropriate depending on the composition of the group III nitride to be etched. Based on PEC etching of GaN, if Al is contained, UV light having a shorter wavelength may be used, and if In is contained, UV light having a longer wavelength can also be used.

Next, an experimental example relating to PEC etching of the first embodiment will be described. In this experimental example, the mask 50 and the cathode pad 30 are formed on the surface 20 to be etched of the 6 mm-square wafer 10 having the laminated structure described with reference to FIG. 1(b), and how the progression state of PEC etching changes was examined by changing the area of the cathode pad 30.

A mixture obtained by mixing a 0.01 M KOH aqueous solution and a 0.05 M $K_2S_2O_8$ aqueous solution in a ratio of 1:1 was used as the etching solution 201. The surface 20 to be etched was irradiated with the UV light 221 through the etching solution 201. The irradiation wavelength of the UV light 221 was 260 nm, and the irradiation intensity (I) of the UV light 221 was 4 mW/cm$^2$. The distance L ($d_{electrolyte}$) from the surface 20 to be etched to the upper surface 202 of the etching solution 201 was 5 mm.

FIGS. 4(a) to 4(e) are respectively photographs showing the masks 50 and the patterns of the cathode pads 30 that are formed on the first to fifth treatment objects (also referred to as "first to fifth samples" hereinafter) according to these experimental examples. A silicon oxide ($SiO_2$) was used to form the masks 50 having opening regions with the same shape on the first to fifth samples. The regions where the masks 50 are formed are indicated as dark regions in FIGS. 4(a) to 4(e).

In FIGS. 4(a) to 4(e), a light region indicates the opening region in the mask 50, that is, the region 21 to be etched. However, a portion indicated as "Ti" indicates the cathode pad 30 made of Ti in the light region in FIGS. 4(a) to 4(e). The area of the portion indicated as "Ti", that is, the area of the cathode pad 30, increases in size in the order of the first to fifth samples. In FIGS. 4(a) to 4(e), a numerical value shown at the top indicates a ratio (also referred to as a "cathode ratio") of the area of the upper surface of the cathode pad 30 to the total area (36 mm$^2$) of the 6-mm square surface 20 to be etched. The cathode ratios of the first to fifth samples are respectively 0.0056 (0.6%), 0.011 (1.1%), 0.022 (2.2%), 0.044 (4.4%), and 0.078 (7.8%).

FIG. 4(f) is a photograph showing the pattern of the mask 50 of the sixth treatment object (also referred to as the "sixth sample" hereinafter). With the sixth sample, Ti was used to form the mask 50 having an opening region with the same shape as the first to fifth samples. Also, the cathode pad 30 was not formed on the sixth sample. Although the sixth sample does not have the cathode pad 30, the mask 50 is made of Ti and functions as the cathode region 40, and thus the sixth sample corresponds to a case where the area of the cathode pad 30 is increased to the utmost limit in the mask 50 having the opening region having the same shape as the first to the fifth samples. The cathode ratio of the sixth sample corresponds to 0.504 (50.4%).

Figure 5A:
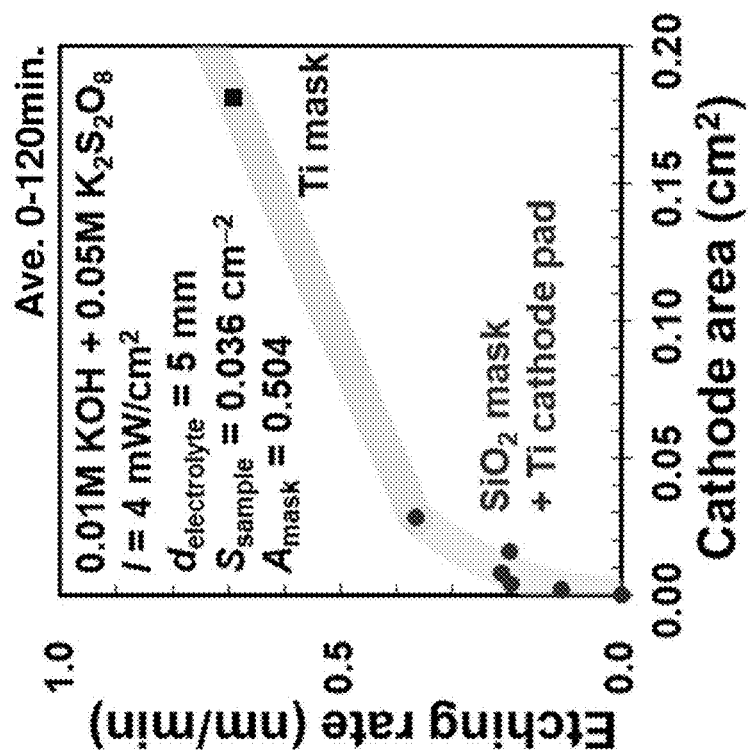
FIGS. 5(a) and 5(b) are graphs illustrating results of PEC etching in experimental examples.
Figure 5B:
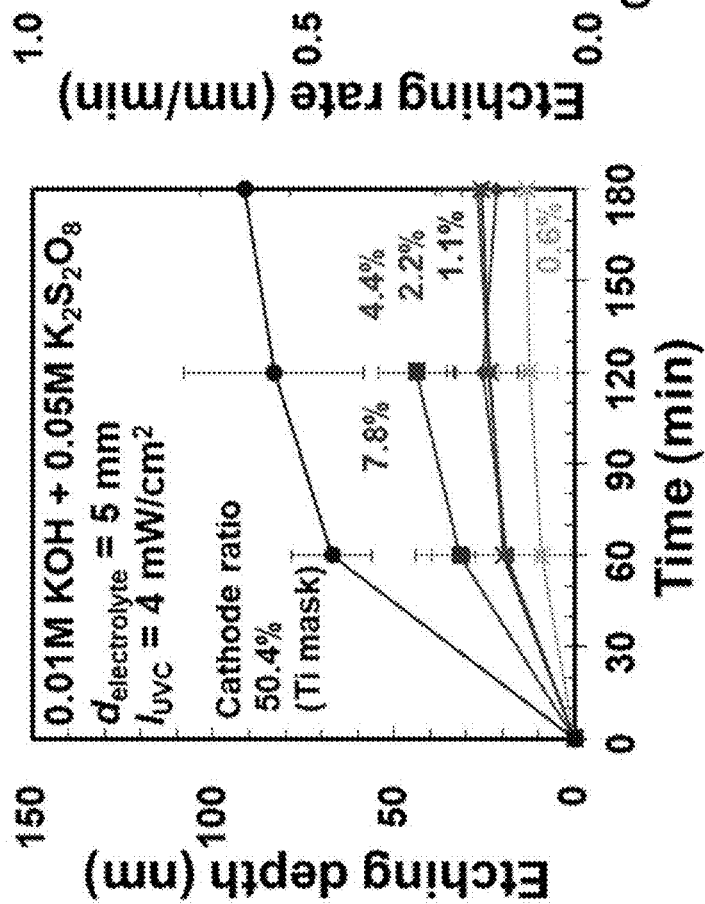

FIGS. 5(a) and 5(b) are graphs illustrating the results of these experimental examples. FIG. 5(a) shows the dependence of the etching depth on the etching time of the first to sixth samples. FIG. 5(b) shows the dependence of the etching rate on the cathode area (a value obtained by converting the cathode ratio into the area) of the first to sixth samples. The etching rate refers to an average rate over an etching time of 120 minutes.

Based on FIGS. 5(a) and 5(b), it can be seen that the etching depth per unit time, that is, the etching rate, can be improved by forming the cathode pad 30. Also, the etching rate can be improved by increasing the cathode ratio (increasing the cathode area).

The criteria for the preferable size of the cathode pad 30 may be as follows, for example. The cathode ratio, that is, the ratio of the cathode area (the area where the cathode pad 30 is in contact with the etching solution 201) to the total area of the surface 20 to be etched is preferably 1% or more, more preferably 2% or more, even more preferably 4% or more, and still more preferably 8% or more.

The criteria for the preferable size of the cathode pad 30 may be as follows, for example. The cathode area (the area where the cathode pad 30 is in contact with the etching solution 201) is preferably larger than the area of the cathode region 40 obtained when the cathode pad 30 is not provided, that is, the total area of the side surfaces (the conductive portions) of the epitaxial layer 12.

Second Embodiment

Next, a structure manufacturing method according to a second embodiment will be described. In the second embodiment, a high-electron-mobility transistor (HEMT) is exemplified as a structure 150 to be manufactured.

Figure 6A:
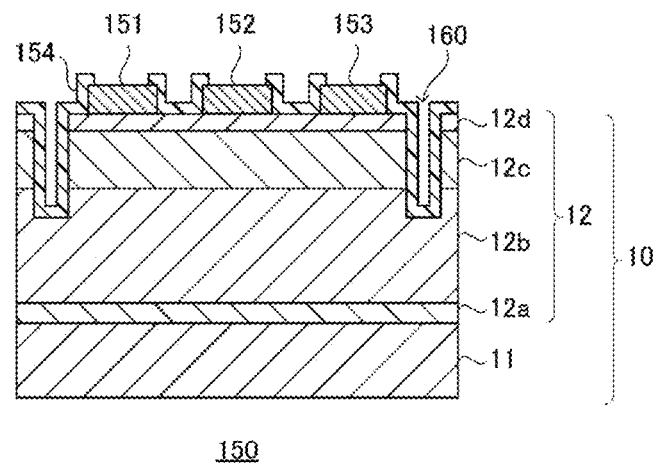
FIG. 6(a) is a schematic cross-sectional view illustrating a structure according to a second embodiment.
Figure 6B:
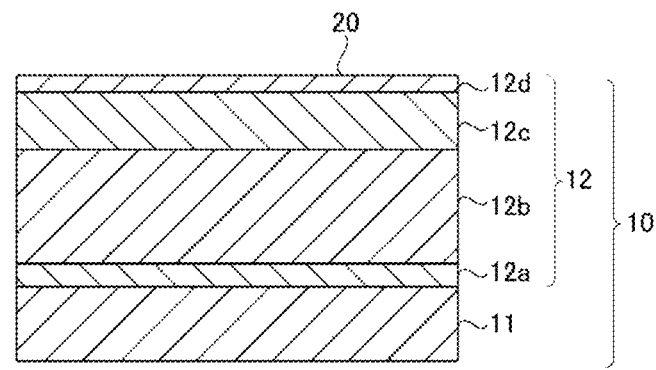
FIG. 6(b) is a schematic cross-sectional view showing an example of an etching target according to the second embodiment.

FIG. 6(a) is a schematic cross-sectional view showing a structure 150 (also referred to as "HEMT 150" hereinafter) according to the second embodiment. FIG. 6(b) is a schematic cross-sectional view showing the wafer 10 used as the material of the HEMT 150.

A semi-insulating SiC substrate is used as the substrate 11, for example. The epitaxial layer 12 used has a laminated structure of a nucleation layer 12a comprising aluminum nitride (AlN), a channel layer 12b comprising GaN and having a thickness of 1.2 μm, a barrier layer 12c comprising aluminum gallium nitride (AlGaN) and having a thickness of 24 nm, and a cap layer 12d comprising GaN and having a thickness of 5 nm, for example. Two-dimensional electron gas (2DEG), which serves as the channel of the HEMT 150, is generated in the laminated portion of the channel layer 12b and the barrier layer 12c.

A source electrode 151, a gate electrode 152, and a drain electrode 153 of the HEMT 150 are formed on the upper surface of the cap layer 12d. A protective film 154 is formed so as to have an opening at the upper surfaces of the source electrode 151, the gate electrode 152, and the drain electrode 153.

The HEMT 150 has a device separation groove 160 for separating adjacent devices from each other. The device separation groove 160 is provided such that the bottom surface thereof is disposed at a position lower than the upper surface of the channel layer 12b, that is, 2DEG is separated by the device separation groove 160 between adjacent devices.

Figure 7:
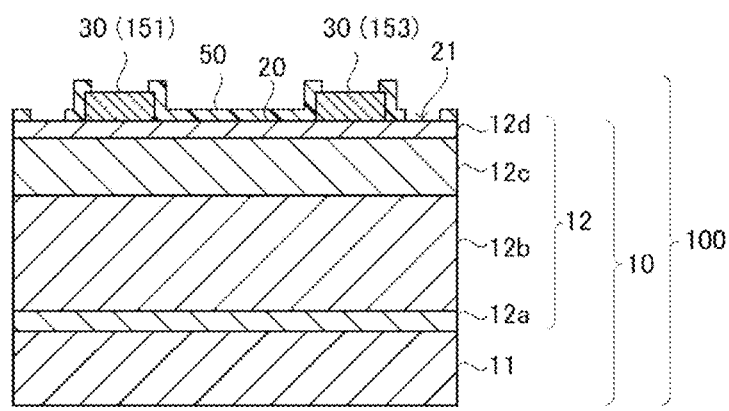
FIGS. 7(a) and 7(b) are respectively a schematic cross-sectional view and a schematic plan view illustrating a treatment object according to the second embodiment.
FIG. 7(c) is a schematic view of a PEC etching apparatus illustrating a PEC etching step according to the second embodiment.
Figure 7:
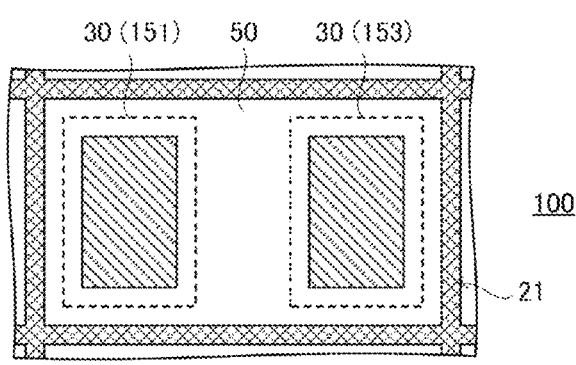
Figure 7:
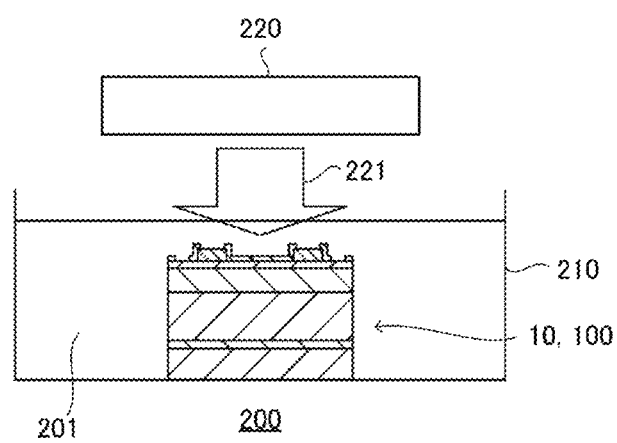

In this embodiment, a mode in which the device separation groove 160 in the HEMT 150 is formed through PEC etching is described as an example. FIG. 7(a) is a schematic cross-sectional view showing the treatment object 100 when performing PEC etching for forming the device separation groove 160. FIG. 7(b) is a schematic plan view of the treatment object 100. FIG. 7 (c) is a schematic cross-sectional view of a PEC etching apparatus 200 illustrating the PEC etching step.

The treatment object 100 in this example has a structure in which the mask 50 for PEC etching is formed on a member in which the source electrode 151 and the drain electrode 153 are formed on the wafer 10. The source electrode 151 and the drain electrode 153 are used as the cathode pads 30. The cathode pads 30 (the source electrode 151 and the drain electrode 153) are formed of Ti/Al/Au in which aluminum (Al) is laminated on Ti and Au is laminated on Al, for example.

The mask 50 is formed on the surface 20 to be etched, which is the upper surface of the cap layer 12d, and has an opening where the region 21 to be etched is exposed, and has openings where the upper surfaces of the cathode pads 30 (the source electrode 151 and the drain electrode 153) are exposed. The region 21 to be etched is a region where the device separation groove 160 is to be formed, and is disposed in a grid pattern so as to surround each HEMT device in a plan view, for example.

The mask 50 is formed of a resist, for example. An etching solution that is acidic (from when etching is started) is preferably used as the etching solution 201. A recessed portion, which is used as the device separation groove 160, is formed of etching the group III nitride that constitutes the region 21 to be etched to a position lower than the upper surface of the channel layer 12b. After this recessed portion (the device separation groove 160) is formed, the mask 50 is removed, the gate electrode 152 is formed, and the protective film 154 is formed. The HEMT 150 is manufactured in this manner.

According to the second embodiment, even if the wafer 10 having a semi-insulating substrate 11 such as a SiC substrate is used and the mask 50 made of a non-conductive material such as a resist is used, the device separation groove 160 in the HEMT 150 can be easily formed through PEC etching.

Third Embodiment

Next, a structure manufacturing method according to a third embodiment will be described. An arrangement mode of the cathode pads 30, which is preferable for enhancing the controllability of the shape of the recessed portion formed through PEC etching, will be described in the third embodiment.

As described in the first embodiment and the second embodiment, even if a mask 50 made of a non-conductive material (also referred to as a "non-conductive mask 50" hereinafter) is used, PEC etching can be favorably advanced as a result of providing the cathode pads 30.

From the viewpoint of facilitating the progression of PEC etching, a portion of the edge of the mask that defines the region 21 to be etched may be constituted by the edge of a cathode pad 30. However, as will be described later, according to the findings obtained by the inventors of this application, from the viewpoint of increasing the controllability of the shape of the recessed portion formed through PEC etching, the entire edge of the mask that defines the region 21 to be etched is preferably constituted by the edge of the non-conductive mask 50 without including the edge of the cathode pads 30.

Such a configuration can be obtained by disposing the cathode pads 30 on the inner side of the non-conductive mask 50 (on the opposite side to the region 21 to be etched) in a plan view, for example, that is, by disposing the cathode pads 30 such that the entire peripheries of the cathode pads 30 are surrounded by the non-conductive mask 50 (see FIG. 7(b), for example).

Figure 12A:
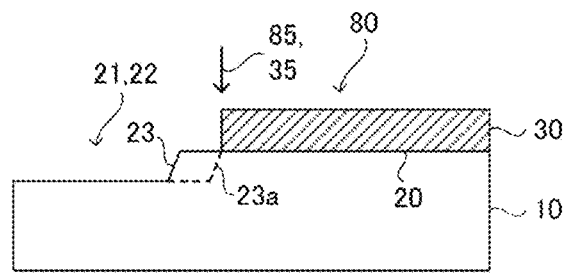
FIGS. 12(a) and 12(b) are respectively a schematic cross-sectional view and a plan view illustrating a mode in which a cathode pad is disposed such that an edge of the cathode pad serves as an edge of a mask that defines a region to be etched.
Figure 12B:
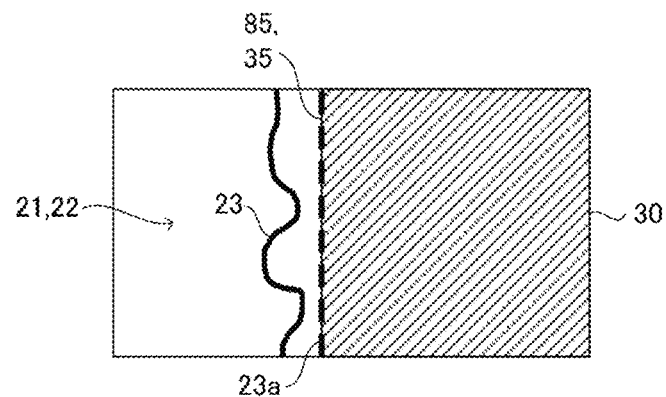

FIGS. 12(a) and 12(b) are respectively a schematic cross-sectional view and a plan view showing a mode in which a cathode pad 30 is disposed such that an edge 35 of the cathode pad 30 is an edge 85 of a mask 80 that defines the region 21 to be etched (diagrams showing portions where the edge 85 of the mask 80 is constituted by the edge 35 of the cathode pad 30).

Because the progression of PEC etching is facilitated by using the cathode pad 30, a recessed portion 22 can be formed in the region 21 to be etched. The edge of the recessed portion 22 is ideally formed along the edge 85 of the mask 80, that is, the edge 35 of the cathode pad 30 (an edge 23a of the recessed portion 22 in the ideal case is indicated by a broken line). However, it was found that, practically, the edge 23 of the recessed portion 22 was formed through PEC etching of this embodiment at a position outside of and separated from the edge 35 of the cathode pad 30 (on the region 21 to be etched side) in an uneven shape in which the distance from the edge 35 is not constant. It is presumed that the reason for this is that a depletion layer is formed on the surface 20 to be etched in the vicinity of the cathode pad 30 due to the cathode pad 30 being conductive.

Figure 13A:
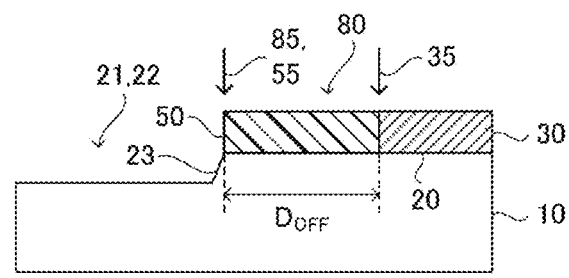
FIGS. 13(a) and 13(b) are respectively a schematic cross-sectional view and a plan view illustrating a mode in which a non-conductive mask and a cathode pad are disposed such that an edge of the non-conductive mask serves as an edge of a mask that defines a region to be etched.
Figure 13B:
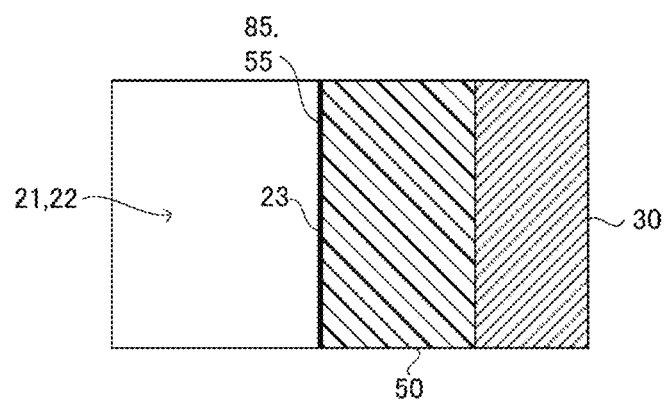

FIGS. 13(a) and 13(b) are respectively a schematic cross-sectional view and a plan view illustrating a mode in which the non-conductive mask 50 and the cathode pad 30 are disposed such that the edge 55 of the non-conductive mask 50 serves as the edge 85 of the mask 80 that defines the region 21 to be etched. In this example, the cathode pad 30 is disposed on the inner side of the non-conductive mask 50 (on the opposite side to the region 21 to be etched).

The (shortest) distance (referred to as the "offset distance" hereinafter) between the edge 85 of the mask 80, that is, the edge 55 of the non-conductive mask 50, and the edge 35 of the cathode pad 30 is regarded as $D_{OFF}$. The inventors of this application found that by extending the offset distance $D_{OFF}$ to some extent or more, it is possible to suppress the influence of the depletion layer resulting from the cathode pad 30, and to form the edge 23 of the recessed portion 22 along the edge 85 of the mask 80 (the edge 55 of the non-conductive mask 50). The offset distance $D_{OFF}$ is preferably 5 μm or more, and more preferably 10 μm or more. The upper limit of the offset distance $D_{OFF}$ is not particularly limited.

As a result of the edge 85 of the mask 80 that defines the region 21 to be etched being constituted by the edge 55 of the non-conductive mask 50 in this manner, it is possible to increase the controllability of the shape of the edge 23 of the recessed portion 22 formed through PEC etching.

Note that, although the cathode pad 30 is disposed inside the edge that has a closed shape of the non-conductive mask 50 that defines the region 21 to be etched in the arrangement mode shown in FIG. 7(b) as an example, an arrangement mode may be adopted in which the cathode pad 30 is disposed outside the edge as needed (according to the structure of a device to be produced, or the like) (e.g., see FIG. 15(a), which will be described later). In such a mode, it is possible to easily secure a long offset distance $D_{OFF}$ from the edge of the non-conductive mask 50 defining the region 21 to be etched to the cathode pad 30.

Figure 14:
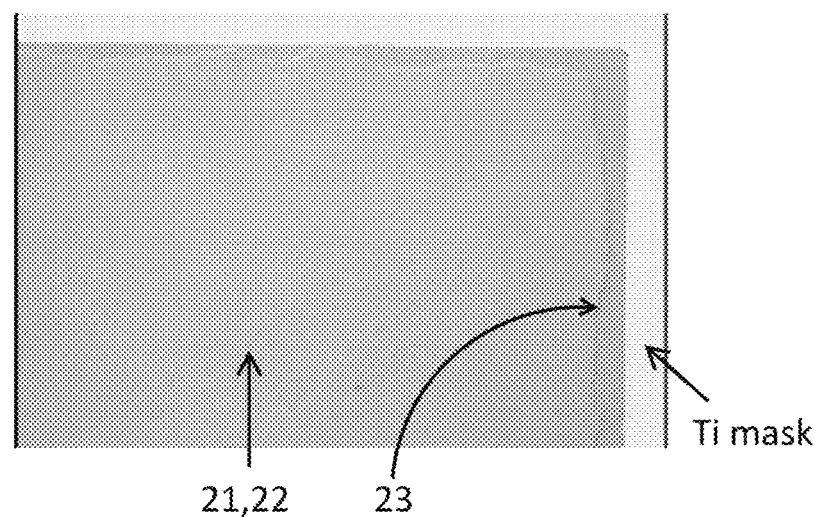
FIG. 14 is a photograph illustrating a result of PEC etching in which a Ti mask is used.

Hereinafter, a result of an experimental example according to the third embodiment will be described. FIG. 14 is a photograph illustrating a result of PEC etching in which the Ti mask is used. In a rectangular region shown in the photograph, light regions in the upper and right side portions indicate the Ti mask. A slightly dark region on the outer side (on the lower or left side) of the Ti mask indicates the region 21 to be etched that is defined by the Ti mask. The edge 23 of the recessed portion 22 formed that has an uneven shape is observed in the region 21 to be etched.

FIG. 15(a) is a photograph showing the treatment object 100 provided with the non-conductive mask 50 and the cathode pads 30. The cathode pads 30 are indicated by light regions, and the non-conductive mask 50 is indicated by a region darker than the cathode pads 30. The region to be etched is defined by the non-conductive mask 50, and is indicated as a (linear) region that is darker than the non-conductive mask 50. The experimental conditions in the experimental example, which will be described with reference to FIGS. 15(a) to 15(c), are the same as the experimental conditions (the irradiation wavelength, the irradiation intensity, and the distance L) in the experimental example, which were described with reference to FIGS. 4(a) to 4(f) in the first embodiment, except that a $K_2S_2O_8$ aqueous solution was used as the etching solution. The non-conductive mask 50 was made of $SiO_2$, and the cathode pad 30 was made of Ti.

FIGS. 15(b) and 15(c) are enlarged photographs of a portion of a region indicated by the upper right circle in FIG. 15(a). A rectangular region with rounded corners 21 to be etched is defined by the non-conductive mask 50 in this circle. FIGS. 15(b) and 15(c) show an upper right corner portion of the region 21 to be etched. FIG. 15(b) is a photograph obtained before PEC etching, and FIG. 15(c) is a photograph obtained after PEC etching. As shown in FIG. 15(b), the width of a portion of the region 21 to be etched that extends in the left-right direction of the paper plane is 76 μm, and the width of a portion of the region 21 to be etched that extends in the up-down direction of the paper plane is 45 μm.

The edge of the mask that defines the region 21 to be etched is constituted by the edge of the non-conductive mask 50 without including the edge of the cathode pads 30. That is, the cathode pad 30 is not disposed at a position where it defines the region 21 to be etched. Also, the edge of the non-conductive mask 50 that defines the region 21 to be etched is sufficiently separated from the cathode pad 30 (more than 5 μm or more than 10 μm) (see FIG. 15(a)).

As can be seen from a comparison between FIGS. 15(b) and 15(c), in this experimental example, the recessed portion 22 is formed so as to substantially coincide with the shape of the opening in the non-conductive mask 50, and the edge 23 of the recessed portion 22 can be formed along the edge of the non-conductive mask 50. As a result of the edge that defines the region 21 to be etched being constituted by the edge of the non-conductive mask 50 without including the edge of the cathode pads 30, it is possible to perform PEC etching with improved controllability of the shape of the recessed portion 22.

Other Embodiments

As described above, the embodiments of the present invention have been specifically described. However, the present invention is not limited to the above-described embodiments, and various modifications, improvements, combinations, and the like can be made without departing from the gist thereof.

The shape, size, arrangement, number, and the like of cathode pads 30 may be adjusted in various manners as needed, for example.

Figure 8A:
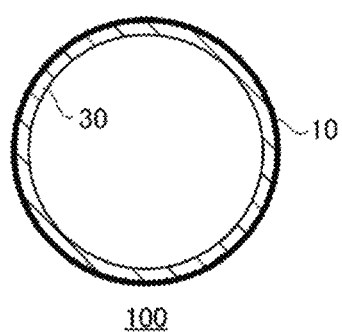
FIGS. 8(a) and 8(b) are schematic plan views of a treatment object illustrating an example in which a cathode pad is disposed along an outer periphery of an etching target.
Figure 8B:
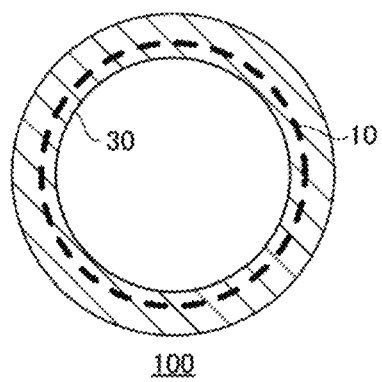

FIGS. 8(a) and 8(b) are schematic plan views of the treatment object 100 illustrating an example in which the cathode pad 30 is disposed along the outer periphery of the wafer 10. The edge of the wafer 10 is indicated by a thick line.

In general, devices are not often formed on the outer peripheral portion of the wafer 10. Thus, by disposing the cathode pad 30 utilizing the outer peripheral portion of the wafer 10, a large region inside the wafer 10 can be easily used to form devices. Also, by disposing the cathode pad 30 along the outer peripheral portion of the wafer 10, a long cathode pad 30 can be easily formed, that is, a large cathode pad 30 can be easily formed.

FIG. 8(a) shows an example in which the cathode pad 30 is disposed along the outer periphery of the wafer 10 on the inner side of the wafer 10 in a plan view. FIG. 8(b) shows an example in which the cathode pad 30 is disposed along the outer periphery of the wafer 10 so as to extend to the outside of the wafer 10 (so as to protrude in the form of an eave) in a plan view. As illustrated in the example shown in FIG. 8(b), by disposing the cathode pad 30 so as to extend to the outside of the wafer 10, it is possible to increase the area where the cathode pad 30 comes into contact with the etching solution 201, and thus to provide a larger cathode region 40. Such a structure is formed by adhering (or contacting) the cathode pad 30, which was prepared as a separate body, to the wafer 10, for example.

Although the case where the substrate 11 of the wafer 10 is a semi-insulating substrate has been described as an example in the above-described first and second embodiments, the substrate 11 may be conductive. That is, if the substrate 11 is conductive, the cathode pad 30 may be provided. If the substrate 11 is conductive, the cathode pad 30 can be provided at any position on the surface of the substrate 11.

Figure 9:
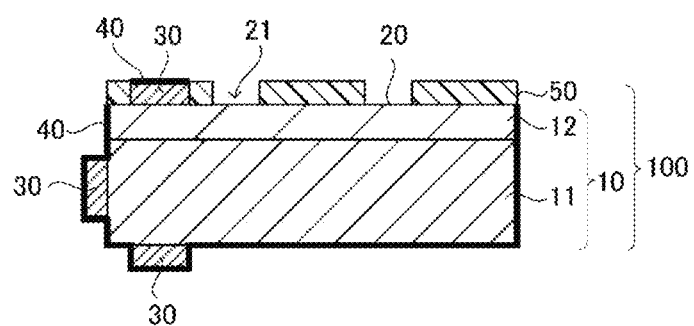
FIG. 9 is a schematic cross-sectional view conceptually illustrating a mode in which a cathode pad is provided on an etching target having a conductive substrate.

FIG. 9 is a schematic cross-sectional view conceptually illustrating a mode in which the cathode pad 30 is provided on the wafer 10 having the conductive substrate 11. If the substrate 11 is conductive, not only can the cathode pad 30 be disposed on the upper surface of the wafer 10 (i.e., on the surface 20 to be etched), the cathode pad 30 can also be disposed on a side surface (of the substrate 11) of the wafer 10, and the cathode pad 30 can also be disposed on the bottom surface (of the substrate 11) of the wafer 10. Note that because the substrate 11 alone is conductive in such a case, a mode is conceivable in which the substrate 11 from which the epitaxial layer 12 is omitted is used as the wafer 10, and the cathode pad 30 is disposed on the upper surface (of the substrate 11) of the wafer 10. Where on the surface of the conductive substrate 11 the cathode pad 30 is to be disposed may be selected as appropriate and as needed.

With regard to the etching solution 201, it is possible to use only the aqueous solution of $K_2S_2O_8$ as the etching solution 201 that is acidic when etching is started, for example. In this case, it is sufficient that the concentration of the $K_2S_2O_8$ aqueous solution is set to 0.025 M, for example.

Furthermore, although a mode in which $S_2O_8^{2-}$ is obtained from potassium persulfate ($K_2S_2O_8$) has been described above, a configuration may be adopted in which $S_2O_8^{2-}$ is obtained from another compound such as sodium persulfate ($Na_2S_2O_8$) or ammonium peroxodisulfate (ammonium persulfate, $(NH_4)_2S_2O_8$).

The etching solution 201 may be kept stationary or kept flowing (moving) during PEC etching. When the etching solution 201 is kept flowing, the same etching solution 201 may be circulated (the etching solution 201 is not replaced), or a new etching solution 201 may be continuously supplied (the etching solution 201 is replaced).

Preferable Aspect of the Present Invention

Hereinafter, preferable aspects of the present invention will be supplementarily described.

(Supplementary Description 1)

There is provided a structure manufacturing method, including:

preparing a treatment object that includes an etching target having a surface to be etched comprising a conductive group III nitride and a region to be etched located on the surface to be etched, and a conductive member that is provided so as to be in contact with at least a portion of a surface of a conductive region of the etching target that is electrically connected to the region to be etched; and etching the group III nitride that constitutes the region to be etched by immersing the treatment object in an alkaline or acidic etching solution containing an oxidizing agent that accepts electrons, and irradiating the surface to be etched with UV light through the etching solution in a state where the region to be etched and the conductive member are in contact with the etching solution, wherein an edge that defines the region to be etched is not constituted by an edge of the conductive member alone (the conductive member is not disposed at a position where it defines the region to be etched).

(Supplementary Description 2)

There is provided the structure manufacturing method according to the supplementary description 1, wherein the treatment object includes a mask formed on the surface to be etched and comprising a non-conductive material, and the edge that defines the region to be etched is configured so as to include an edge of the mask (the mask is disposed at the position where it defines the region to be etched).

(Supplementary Description 3)

There is provided the structure manufacturing method according to the supplementary description 2, wherein the mask is formed of a resist, and the etching solution is acidic.

(Supplementary Description 4)

There is provided the structure manufacturing method according to any one of the supplementary descriptions 1 to 3, wherein the etching solution is acidic.

(Supplementary Description 5)

There is provided the structure manufacturing method according to any one of the supplementary descriptions 1 to 4, wherein the group III nitride undergoes etching in a state where an upper surface of a portion of the conductive member that is provided on the surface to be etched is in contact with the etching solution.

(Supplementary Description 6)

There is provided the structure manufacturing method according to any one of the supplementary descriptions 1 to 5, wherein the etching target is used as a material of a high-electron-mobility transistor, and the conductive member is used as an electrode of the high-electron-mobility transistor.

(Supplementary Description 7)

There is provided the structure manufacturing method according to the supplementary description 6, wherein a recessed portion formed by etching the region to be etched is used as a device separation groove in the high-electron-mobility transistor.

(Supplementary Description 8)

There is provided the structure manufacturing method according to any one of the supplementary descriptions 1 to 7, wherein the conductive member is disposed along an outer periphery of the etching target in a plan view.

(Supplementary Description 9)

There is provided the structure manufacturing method according to any one of the supplementary descriptions 1 to 8, wherein the conductive member is disposed so as to extend to the outside of the etching target in a plan view.

(Supplementary Description 10)

There is provided the structure manufacturing method according to any one of the supplementary descriptions 1 to 9, wherein the etching target includes a semi-insulating substrate.

(Supplementary Description 11)

There is provided the structure manufacturing method according to the supplementary description 10, wherein the conductive member is provided on a group III nitride layer formed on the semi-insulating substrate.

(Supplementary Description 12)

There is provided the structure manufacturing method according to the supplementary description 11, wherein the area where the conductive member comes into contact with the etching solution is preferably 1% or more, more preferably 2% or more, even more preferably 4% or more, and still more preferably 8% or more of the total area of the surface to be etched that serves as an upper surface of the group III nitride layer.

(Supplementary Description 13)

There is provided the structure manufacturing method according to the supplementary description 11 or 12, wherein the area where the conductive member comes into contact with the etching solution is larger than the total area of a side surface of the group III nitride layer.

(Supplementary Description 14)

There is provided the structure manufacturing method according to any one of the supplementary descriptions 1 to 9, wherein the etching target includes a conductive substrate.

(Supplementary Description 15)

There is provided the structure manufacturing method according to the supplementary description 14, wherein the conductive member is disposed on a surface of a group III nitride layer formed on the conductive substrate.

(Supplementary Description 16)

There is provided the structure manufacturing method according to the supplementary description 14 or 15, wherein the conductive member is disposed on a surface of the conductive substrate.

(Supplementary Description 17) There is provided an intermediate structure including:

an etching target having a surface to be etched comprising a conductive group III nitride and a region to be etched located on the surface to be etched; and a conductive member that is provided so as to be in contact with at least a portion of a surface of a conductive region of the etching target that is electrically connected to the region to be etched, wherein the intermediate structure is immersed in an alkaline or acidic etching solution containing an oxidizing agent that accepts electrons, in a state where the region to be etched is in contact with the conductive member, and an edge that defines the region to be etched is not constituted by an edge of the conductive member alone (the conductive member is not disposed at a position where it defines the region to be etched).

(Supplementary Description 18)

There is provided the intermediate structure according to the supplementary description 17, further including a mask formed on the surface to be etched and comprising a non-conductive material, wherein the edge that defines the region to be etched is configured so as to include an edge of the mask (the mask is disposed at the position where it defines the region to be etched).

(Supplementary Description 19)

There is provided the intermediate structure according to the supplementary description 17 or 18, wherein the mask is formed of a resist.

(Supplementary Description 20)

There is provided the intermediate structure according to any one of the supplementary descriptions 17 to 19, wherein the etching target is used as a material of the high-electron-mobility transistor, and the conductive member is used as an electrode of the high-electron-mobility transistor.

(Supplementary Description 21)

There is provided the intermediate structure according to any one of the supplementary descriptions 17 to 20, wherein the conductive member is disposed along an outer periphery of the etching target in a plan view.

(Supplementary Description 22)

There is provided the intermediate structure according to the supplementary description 21, wherein the conductive member is disposed so as to extend to the outside of the etching target in a plan view.

(Supplementary Description 23)

There is provided the intermediate structure according to any one of the supplementary descriptions 17 to 22, wherein the etching target includes a semi-insulating substrate.

(Supplementary Description 24)

There is provided the intermediate structure according to any one of the supplementary descriptions 17 to 22, wherein the etching target includes a conductive substrate.

(Supplementary Description 25)

There is provided the intermediate structure according to the supplementary description 24, wherein the conductive member is disposed on a surface of the conductive substrate.

(Supplementary Description 26)

There is provided the intermediate structure according to any one of the supplementary description 17 to 25, wherein the surface to be etched is irradiated with UV light through the etching solution.

(Supplementary Description 27)

There is provided a method for processing a group III nitride crystal, in which electrochemical etching is performed in a state where a crystal comprising a group III nitride is immersed in an etching solution, the method including:

defining a region to be etched and a region other than the region to be etched on a surface of the group III nitride; and etching the group III nitride by irradiating the surface with UV light through the etching solution, wherein a conductive member configured to function as a cathode for emitting electrons to the etching solution is connected to (is brought into contact with) a portion of the region other than the region to be etched.

(Supplementary Description 28)

There is provided the structure manufacturing method according to the supplementary description 2, wherein an edge that defines the region to be etched is constituted by an edge of the mask without including an edge of the conductive member.

(Supplementary Description 29)

There is provided the structure manufacturing method according to the supplementary description 28, wherein the distance between the edge of the mask and the edge of the conductive member is preferably 5 µm or more and more preferably 10 µm or more.

(Supplementary Description 30)

There is provided the structure manufacturing method according to the supplementary description 28 or 29, wherein the conductive member is disposed such that the entire periphery of the conductive member is surrounded by the mask in a plan view.

(Supplementary Description 31)

There is provided the intermediate structure according to the supplementary description 18, wherein the edge that defines the region to be etched is constituted by the edge of the mask without including the edge of the conductive member.

(Supplementary Description 32)

There is provided the intermediate structure according to the supplementary description 31, wherein the distance between the edge of the mask and the edge of the conductive member is preferably 5 µm or more and more preferably 10 µm or more.

(Supplementary Description 33)

There is provided the intermediate structure according to the supplementary description 31 or 32, wherein the conductive member is disposed such that the entire periphery of the conductive member is surrounded by the mask in a plan view.

LIST OF REFERENCE NUMERALS

10 Etching target
20 Surface to be etched
21 Region to be etched
30 Cathode pad
50 Mask
100 Treatment object
150 Structure
200 PEC etching apparatus
201 Etching solution
202 Upper surface of etching solution
210 Container
220 Light source
221 UV light

The invention claimed is:

1. A structure manufacturing method comprising:
preparing a treatment object that includes an etching target having a surface to be etched comprising a conductive group III nitride and a region to be etched located on the surface to be etched, a conductive member that is provided so as to be in contact with at least a portion of a surface of a conductive region of the etching target that is electrically connected to the region to be etched, and a mask formed on the surface to be etched and comprising a non-conductive material; and
etching the group III nitride that constitutes the region to be etched by immersing the treatment object in an alkaline or acidic etching solution containing peroxodisulfate ions as an oxidizing agent that accepts electrons, and irradiating the surface to be etched with light through the etching solution in a state where the region to be etched and the conductive member are in contact with the etching solution,
wherein an edge that defines the region to be etched is constituted by an edge of the mask without including an edge of the conductive member.

2. The structure manufacturing method according to claim 1,
wherein the distance between the edge of the mask that defines the region to be etched and the edge of the conductive member is 5 μm or more.

3. The structure manufacturing method according to claim 1,
wherein, in the etching of the group III nitride that constitutes the region to be etched, the etching is performed such that an edge of a recessed portion is formed through the etching along the edge that defines the region to be etched.

4. The structure manufacturing method according to claim 1,
wherein the mask is formed of a resist, and
the etching solution is acidic.

5. The structure manufacturing method according to claim 1,
wherein the group III nitride undergoes etching in a state where an upper surface of a portion of the conductive member that is provided on the surface to be etched is in contact with the etching solution.

6. The structure manufacturing method according to claim 1,
wherein the etching target is used as a material of a high-electron-mobility transistor, and
the conductive member is used as an electrode of the high-electron-mobility transistor.

7. The structure manufacturing method according to claim 6,
wherein a recessed portion formed by etching the region to be etched is used as a device separation groove in the high-electron-mobility transistor.

8. The structure manufacturing method according to claim 1,
wherein the conductive member is disposed along an outer periphery of the etching target in a plan view.

9. The structure manufacturing method according to claim 1,
wherein the etching target includes a semi-insulating substrate.

10. The structure manufacturing method according to claim 9,
wherein the conductive member is provided on a group III nitride layer formed on the semi-insulating substrate.

11. The structure manufacturing method according to claim 10,
wherein the area where the conductive member comes into contact with the etching solution is 1% or more of the total area of the surface to be etched that serves as an upper surface of the group III nitride layer.

12. The structure manufacturing method according to claim 1,
wherein the etching target includes a conductive substrate.

13. The structure manufacturing method according to claim 12,
wherein the conductive member is disposed on a surface of the conductive substrate.

14. An intermediate structure comprising:
an etching target having a surface to be etched comprising a conductive group III nitride and a region to be etched located on the surface to be etched;
a conductive member that is provided so as to be in contact with at least a portion of a surface of a conductive region of the etching target that is electrically connected to the region to be etched; and
a mask formed on the surface to be etched and comprising a non-conductive material,
wherein the intermediate structure is immersed in an alkaline or acidic etching solution containing peroxodisulfate ions as an oxidizing agent that accepts electrons, in a state where the region to be etched is in contact with the conductive member, and
an edge that defines the region to be etched is constituted by an edge of the mask without including an edge of the conductive member.

15. The intermediate structure according to claim 14,
wherein the distance between the edge of the mask that defines the region to be etched and the edge of the conductive member is 5 μm or more.

16. The intermediate structure according to claim 14,
wherein the mask is formed of a resist.

17. The intermediate structure according to claim 14,
wherein the etching target is used as a material of a high-electron-mobility transistor, and
the conductive member is used as an electrode of the high-electron-mobility transistor.

18. The intermediate structure according to claim 14,
wherein the conductive member is disposed along an outer periphery of the etching target in a plan view.

19. The intermediate structure according to claim 14,
wherein the etching target includes a semi-insulating substrate.

20. The intermediate structure according to claim 14, wherein the etching target includes a conductive substrate.

21. The intermediate structure according to claim 20, wherein the conductive member is disposed on a surface of the conductive substrate.

22. A structure manufacturing method comprising:
preparing a treatment object that includes an etching target having a surface to be etched comprising a conductive group III nitride and a region to be etched located on the surface to be etched, and a conductive member that is provided so as to be in contact with at least a portion of a surface of a conductive region of the etching target that is electrically connected to the region to be etched; and
etching the group III nitride that constitutes the region to be etched by immersing the treatment object in an alkaline or acidic etching solution containing an oxidizing agent that accepts electrons, and irradiating the surface to be etched with light through the etching solution in a state where the region to be etched and the conductive member are in contact with the etching solution,
wherein an edge that defines the region to be etched is not constituted by an edge of the conductive member alone, and
the conductive member is disposed along an outer periphery of the etching target in a plan view.

23. An intermediate structure comprising:
an etching target having a surface to be etched comprising a conductive group III nitride and a region to be etched located on the surface to be etched; and
a conductive member that is provided so as to be in contact with at least a portion of a surface of a conductive region of the etching target that is electrically connected to the region to be etched,
wherein the intermediate structure is immersed in an alkaline or acidic etching solution containing an oxidizing agent that accepts electrons, in a state where the region to be etched is in contact with the conductive member,
an edge that defines the region to be etched is not constituted by an edge of the conductive member alone, and
the conductive member is disposed along an outer periphery of the etching target in a plan view.

* * * * *